United States Patent [19]

Zaleski

[11] Patent Number: 4,831,560

[45] Date of Patent: May 16, 1989

[54] METHOD FOR TESTING AUTO ELECTRONICS SYSTEMS

[76] Inventor: James V. Zaleski, 1631 Paterna Rd., Santa Barbara, Calif. 93103

[21] Appl. No.: 89,593

[22] Filed: Aug. 26, 1987

Related U.S. Application Data

[62] Division of Ser. No. 819,252, Jan. 15, 1986.

[51] Int. Cl.$^4$ ............................................. G06F 15/20
[52] U.S. Cl. ........................... 364/551.01; 364/431.01;
364/424.03; 371/20; 73/116
[58] Field of Search ...................... 371/20; 364/431.01,
364/431.11, 431.12, 551.01, 579; 324/73 AT;
73/116, 118.1

[56] References Cited

U.S. PATENT DOCUMENTS

| | | | |
|---|---|---|---|
| 4,055,801 | 10/1977 | Pike et al. | 324/73 AT |
| 4,192,451 | 3/1980 | Swerling et al. | 371/20 |
| 4,234,921 | 11/1980 | Kinoshita et al. | 364/424 |
| 4,375,672 | 3/1983 | Kato et al. | 364/551 |
| 4,402,055 | 8/1983 | Lloyd et al. | 324/73 AT |
| 4,644,284 | 2/1987 | Friedline et al. | 73/116 |

OTHER PUBLICATIONS

Smith et al, C-MOS Microprocessor Wakes Itself Up, 9/25/80, Electronics, pp. 123-126.

Watchdog Timer Lets Microcomputer Monitor Itself, 9/9/82, Electronic Design, vol. 30, No. 25, p. 23.
Fasciano et al, Computer Aided Test of Sensor Based Systems, 3/72, IBM Technical Disclosure Bulletin, vol. 14, No. 10, p. 3067.

Primary Examiner—Parshotam S. Lall
Assistant Examiner—Tuan A. Duong
Attorney, Agent, or Firm—Koppel & Jacobs

[57] ABSTRACT

An interactive method for testing vehicle electronics systems is disclosed in which various vehicle subsystems are exercised under the control of the tester unit while the performance of associated subsystems are monitored to detect and isolate malfunctions. The tester includes interchangeable program cartridges that can be easily inserted to adapt the unit for a variety of different vehicles and test procedures, and also optional interchangeable input/output cartridges for test procedures in which additional access to or from the tester or peripheral devices is necessary. The test unit accesses the vehicle's electronics data bus by means of an assembly line diagnostic link, the access being accomplished via a multiplexer that makes it possible to locate faults on the data bus itself. The tester greatly reduces the time and effort necessary to analyze malfunctions in the field, and is considerably more comprehensive than prior test equipment.

6 Claims, 11 Drawing Sheets

METHOD FOR TESTING AUTO ELECTRONICS SYSTEMS

RELATED APPLICATION

This is a division of co-pending U.S. patent application Serial No. 819,252, filed Jan. 15, 1986, and issued after the filing date of this application as Patent No. 4,694,408 issued Sept. 15, 1987 to Zaleski.

BACKGROUND OF THE INVENTION

1. Field of the Invention

This invention relates to automobile testing methods, and more particularly to the diagnostic testing of automobile electronics systems.

2. Description of the Prior Art

As the use of electronics to control and perform various automotive functions becomes more prevalent, the quick, accurate and comprehensive testing of automotive electronics systems has grown to be more of a problem. (The term "automobile" as used herein includes trucks and other vehicles having electronics systems analogous to those found in automobiles.) Currently available field test equipment is generally passive in nature. The testers monitor the outputs of various electronics systems in the automobile for a given operating condition, such as the motor idling, in an attempt to determine the cause of a malfunction. However, it may not be possible to determine the cause of many malfunctions without taking the automobile through a sequence of operating conditions, such as starting the engine and accelerating to a high speed, and simultaneously observing the condition of the electronics systems during the testing sequence. Available testers do not have any convenient mechanism for sequencing an automobile through a variety of operating conditions, and are generally limited in the number of different responses they can observe.

The inability to perform comprehensive diagnostic testing of electronics systems at the local site level can result in great inefficiencies. For example, it is often difficult to determine whether a particular problem resides in the engine or the transmission. Of transmissions which are shipped back to the factory for correction, the majority are returned with no problem having been located, while in most of the remainder the problem is corrected by a minor adjustment at the factory that could have been made in the field had the proper diagnostic equipment been available.

Another complicating factor in electronics testing is the proliferation of many different electronics systems for different makes of cars, among different models from the same automotive manufacturer, and even annual changes within the same model line. The different electronics systems are generally accompanied by different data formats that limit any particular testing unit to only a relatively small number of vehicles. Stocking a large number of different monitors to accommodate the various makes and models is expensive, inefficient and wasteful. However, due to the complexity of current electronics systems, it is difficult and sometimes impossible to perform adequate field service without the use of proper electronic testers.

The proliferation of different electronics systems is not limited to different makes and models; often the same model car will employ significantly different data format with each successive model year. This rapidly obsoletes testers which are dedicated to any particular make or model.

Another problem is the difficulty in simulating normal driving conditions within the confines of an automotive repair shop, while at the same time monitoring the various electronics systems to determine the location and nature of any malfunctions. Also, some automotive problems are intermittent and do not show up in a single test run. Current testers do not have the capability of monitoring a vehicle's performance over a long period of time and capturing the status of the various electronics systems when an intermittent malfunction occurs so as to enable effective diagnostic analysis.

SUMMARY OF THE INVENTION

In view of the above problems associated with the prior art, it is an object of the present invention to provide a novel and improved testing method for automotive electronics systems which provides for both passive monitoring of the various systems, and for the active exercising and control of a particular system and the simultaneous monitoring of associated electronics systems to identify any malfunctions related to the system being tested.

Another object is the provision of a novel and improved automotive electronics testing method which can be easily and inexpensively adapted for use with many different kinds of automobiles having a wide variety of electronic data formats.

A further object is the provision of such a testing method for continuously monitoring an automobile during normal use and for activating the unit upon the occurrence of an intermittent malfunction to locate and diagnose the problem.

These and other objects are accomplished in the present invention by means of a diagnostic test unit which includes a microprocessor that both controls an active test sequence applied to specified electronics systems in the automobile and monitors the responses of associated systems; a means such as a keyboard for providing operational controls to the microprocessor; a display for operator real time readout of test results; a program means for providing diagnostic test sequences to the microprocessor; a transceiver which provides a two-way interface between the microprocessor and the automobile electronics systems to transmit test signals from the microprocessor for exercising particular systems in the automobile, and to enable the microprocessor to monitor the condition of associated systems while the first system is being exercised; and a power supply for the unit. The tester is adapted to receive a number of interchangeable program cartridges, each cartridge providing desired test sequences for particular makes, models and years. In this way the field test site need only inventory a collection of small and relatively inexpensive cartridges, each of which can be inserted into a single testing unit as needed.

The automobile's internal electronics data bus to which many of its electronics systems are connected is accessed by connecting the tester to an associated assembly line diagnostic link (ALDL). For automobiles in which the electronics data bus is provided as a ring bus with a pair of output terminals, the tester is connected to both terminals and provided with a multiplexer which multiplexes test patterns onto both terminals. Each of the automobile systems on the data bus can thus continue to be accessed despite the presence of a fault on the bus, and the location of the fault can be found by determining the penetration of each multiplexed connection.

In a manner similar to the interchangeable memory cartridges, the tester is also adapted to receive a number of different input/output cartridges. These latter cartridges are used for tests which require accessing the automotive electronics both through the assembly line diagnostic link and also at various special test points not on the assembly line data link, or for interfacing with peripheral equipment. An input/output cartridge can also be provided for communicating the test results to a remote location, such as a central diagnostic center.

In addition, the tester can be used as a portable vehicle data monitor to detect intermittent malfunctions during normal driving. Connected to the data bus in a low power standby mode, the tester "wakes" itself up when it senses data bus activity, and then monitors the activity on the data bus to capture the status of the various electronics systems in memory at the moment a malfunction occurs.

These and other features and advantages of the invention will be apparent to those skilled in the art from the following detailed description of preferred embodiments, taken together with the accompanying drawings, in which:

DESCRIPTION OF THE DRAWINGS

FIGS. 5, 6 and 7 are respectively plan, frontal elevational and side elevational views of an input/output cartridge used in connection with the tester;

DETAILED DESCRIPTION OF PREFERRED EMBODIMENTS

Figure 1:
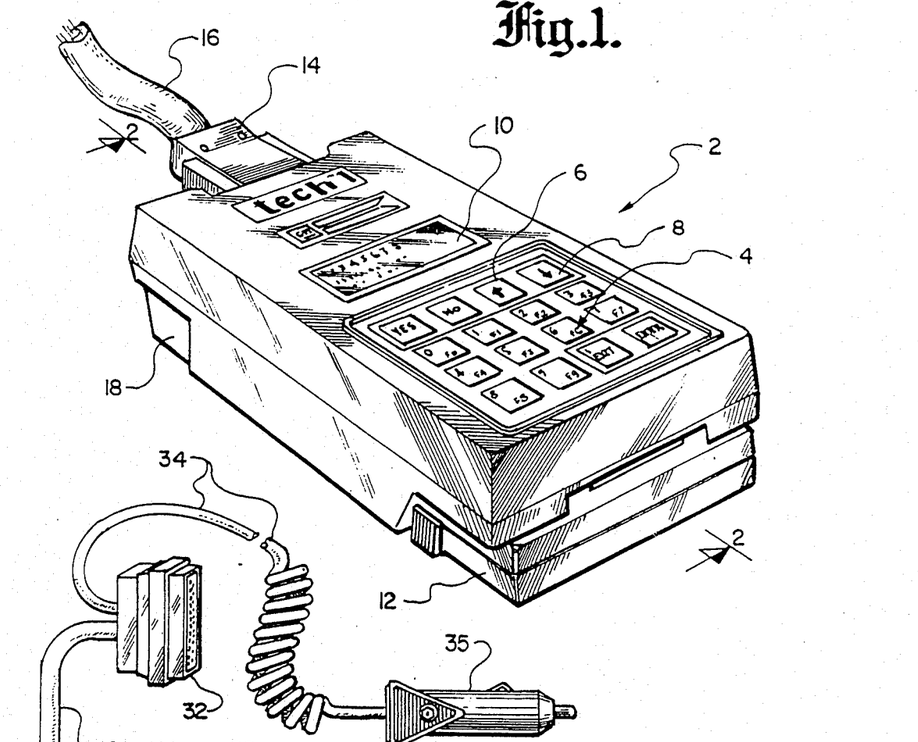
FIG. 1 is a perspective view of a portable automobile electronics testing unit constructed in accordance with the invention.

A perspective view of the hand held automotive electronics tester provided by the present invention is given in FIG. 1. The tester is contained in a housing 2 that is very convenient to handle, weighing less than 3 pounds and approximately 8 inches long, 3.7 inches wide and 1.875 inches deep. A 16 key, multi-function keyboard 4 with tactile feel provides program instructions to the internal tester electronics. The functions of the various keys depend upon the particular tests being conducted, but in general the keys can be used to vary the automotive condition so that the operation of the car's electronics systems can be monitored under different conditions. For example, for testing with the motor running, the "accelerate" button 6 can be depressed to speed up the engine, while the "decelerate" button 8 can be depressed to slow the engine down. In general, testing is performed in a pre-programmed sequence, as explained further below, but manual overrides and operational controls can be input through the keyboard. An alphanumeric liquid crystal display 10 provides information on the testing results; the particular information to be displayed can also be controlled through the keyboard 4.

The tester includes built-in software routines that are independent of any particular testing application, and are useful in a variety of different applications. The built-in routines fall into four categories: executive routines; serial data handling routines; self-test routines; and general utility routines.

In addition to the built-in software, the tester housing includes a receptacle for interchangeable plug-in program cartridges 12. Each cartridge is programmed to run one or more particular test sequences for a particular automotive model or series of models. After a test sequence has been completed, the cartridge may simply be removed and replaced with a different cartridge, thereby making it possible to perform different tests on different types of cars having very different electronics systems with a single tester and an inventory of inexpensive program cartridges. Some examples of the different types of cartridges that can be provided are:

Engine Control Module Testing Cartridge

This test program is similar to conventional passive testing, in which data is obtained from the vehicle's engine control module (ECM), including ECM malfunction codes as well as diagnostic data. The data streams are captured on a scheduled or event-triggered basis, scaled, and displayed in pre-selected or operator selected pairs. Various readout modes can be selected by the operator.

System Diagnostic Testing Cartridge

The diagnostic test cartridge has three capabilities: subsystem testing, vehicle service diagnostics, and intermittent or "snapshot" testing. The subsystem testing provides the ability to monitor and control all serial data coming from or going to any specified automotive electronics subsystem. This allows the technician to decouple the subsystem from the normal master-directed operation and exercise it independently of all other subsystems. The subsystem tests include:

(1) BCM. A passive monitoring of all normal communications transmitted from or received by the master controller, or body computer module (BCM), including data to and from the engine control module (ECM), instrument panel cluster (IPC), heating, ventilation and air conditioning unit (HVAC) and secondary displays.

(2) ECM. In the ECM tests the technician can either monitor ECM serial data, or control certain ECM discrete outputs. The output control function allows the technician to control such outputs as the torque converter clutch, the canister purge solenoid or the idle air control motor.

(3) IPC. Such IPC operational data as the fuel gauge or IPC switch closures can be monitored. The tester can also assume control of the serial data bus and emulate the BCM relative to its control of the IPC to determine whether or not a problem is in the IPC. For example, IPC displays can be controlled, display segments tested, and telltails turned on and off.

(4) HVAC. As with the previous tests, the HVAC test provides the technician with the capability of monitoring normal communications with the HVAC. In the control tests, all of the discrete output commands of the HVAC can be controlled such as positioning the air flow doors, engaging/disengaging A/C clutch, and controlling the blower motor speed.

(5) Secondary Display. With this cartridge the tester can monitor data transmitted to or from each of the displays, as well as control a portion of the function which the devices can display, such as driving individual displays or performing display segment tests.

With the vehicle service diagnostic test, the tester is capable of performing almost all of the functions performed by the vehicle's on-board service diagnostics, including displaying ECM and BCM malfunction codes, monitoring assembly line diagnostic link (ALDL) discrete and analog parameters, and controlling ECM and BCM outputs. This cartridge also provides a number of enhancements over the on-board service diagnostics.

For intermittent testing, the cartridge enables the tester to monitor various subsystems and capture a "snapshot" of the serial data under certain conditions. These conditions can include the occurrence of a specified ECM or BCM malfunction code, the occurrence of any ECM or BCM malfunction code, the occurrence of any malfunction code, or a manual trigger via the tester keyboard 4. Once the intermittent test trigger has occurred, the program cartridge enables the technician to select between displaying up to 64 samples of ALDL data before and after the trigger, including malfunction codes, or displaying the normal communication data. The tester can be left in place on the vehicle during normal operation away from the field service center, with the intermittent test mode used to capture the subsystem conditions upon the occurrence of a particular intermittent malfunction and thus diagnose the malfunction.

Functional Test Director Cartridge

This program cartridge contains a functional test director that automatically executes a series of engine control tests interactively with the service technician. The functional test director provides the service technician with subsystem-level fault isolation, such as the $O_2$ sensor circuit, fan circuit, etc., by exercising particular subsystems in turn and concurrently monitoring the condition of associated subsystems. When a particular fault has been isolated, the functional test director stops executing and notifies the technician of the problem area, as well as a key into the vehicle's service manual to be used to solve the problem. Various subsystems or engine problems which may be included as part of the fault isolation are: throttle positions sensor; reference pulse sensor circuit; park/neutral switch circuit; manifold air pressure (MAP) sensor; idle arm control (IAC) motor; oxygen sensor; system rich/lean; fan circuit; thermostat.

This program cartridge also allows a subset of the engine control tests executed by the functional test director to be executed on an individual basis by the technician. The individual tests provide the technician with the same type of information as the functional test director for the selected subsystem.

The functional test director is an example of one application of the basic tester.

Communications Interface Cartridge

This program cartridge provides a standard RS232C interface for the tester which allows the tester to be interfaced with printers, modems, full function keyboards or remote host computers. The cartridge includes a 16K byte EPROM which controls software that allows for a remote keyboard operation bypassing the tester keyboard 4 for user-defined key commands; remote display of the tester display parameters; transmission of remote host-selected parameters; and transmission of raw, unprocessed vehicle data. With this cartridge an auto can be tested from a remote location where better facilities or more trained personnel may be located.

The cartridge can also be used to debug tester software during development via a CRT/keyboard or personal computer by the use of routines such as the Motorola "LILbug" debug routine.

Additional Program Cartridges

Further program cartridges which may be inserted into the tester include ones for transmission diagnostics, remote radio/control head diagnostics, digital voltohmmeter, vibration analyzer, multiplex system exerciser and others. Also, different cartridges may have to be provided to perform the same types of tests on different models or even for different annual versions of the same model.

Continuing with the description of the basic tester shown in FIG. 1, a plug-in connector 14 is inserted into a multiprong input/output socket on the tester and held in place by means of screws on either side of the connector. A cable 16 extends from the connector and is provided at its opposite end with another connector (not shown) that connects to the vehicle's electronic data bus via the ALDL. This is the basic communications link by which the condition of the various automobile systems are monitored by the tester, and active signals applied from the tester to exercise selected vehicle systems. Power is also supplied from the vehicle cigarette lighter socket via cable 16 to the tester.

In addition to the basic connection between the tester and vehicle via connector 14 and cable 16, certain additional tests may be accomplished by connecting the tester to both the ALDL and a second location on the vehicle, or it may be desired to connect the tester to peripheral input/output devices such as a modem or printer. For this purpose, a second receptacle is provided in the tester for a removable input/output cartridge 18 that provides the second connection to the vehicle or peripheral device. Examples of test functions that would require both the ALDL connector and a separate input/output cartridge include hydramatic power train and air conditioner diagnostic testing.

Figure 2:
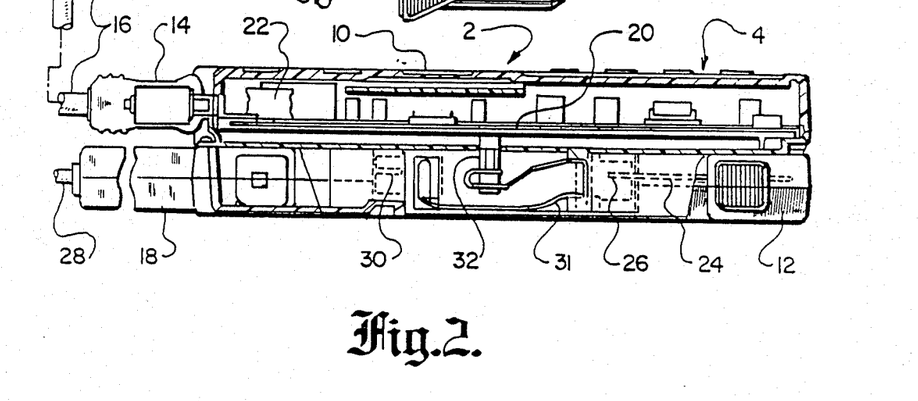
FIG. 2 is a sectional view taken along the lines 2—2 of FIG. 1.

The internal mechanical structure of the tester is shown in FIG. 2. The internal electronics are mounted on a main circuit board 20, including a transformer 22 used to supply the tester with power from the vehicle. A program cartridge 12 is shown in place, with its electronics mounted on a circuit board 24 and connected to the tester electronics via an edge board connector 26.

An input/output cartridge 18 with its electronics acquires data from its associated cable 28 and provides it to the tester electronics via an edge board connector 30. A flat cable 31 connects the program cartridge 12 and input/output cartridge 18 to the microprocessor bus on the main circuit card 20 via connector 32. Cable 16 is a 12 lead cable which extends from the tester to an ALDL connector 33. In addition to providing a connection to the vehicle ALDL, connector 33 ties two of the cable 16 leads to a two-wire coiled cable 34 that connects to a cigarette lighter adaptor 35. Adaptor 35 plugs into the vehicle's cigarette lighter to provide power to the tester via cable 35, ALDL connector 32 and cable 16.

Figures 3, 4:
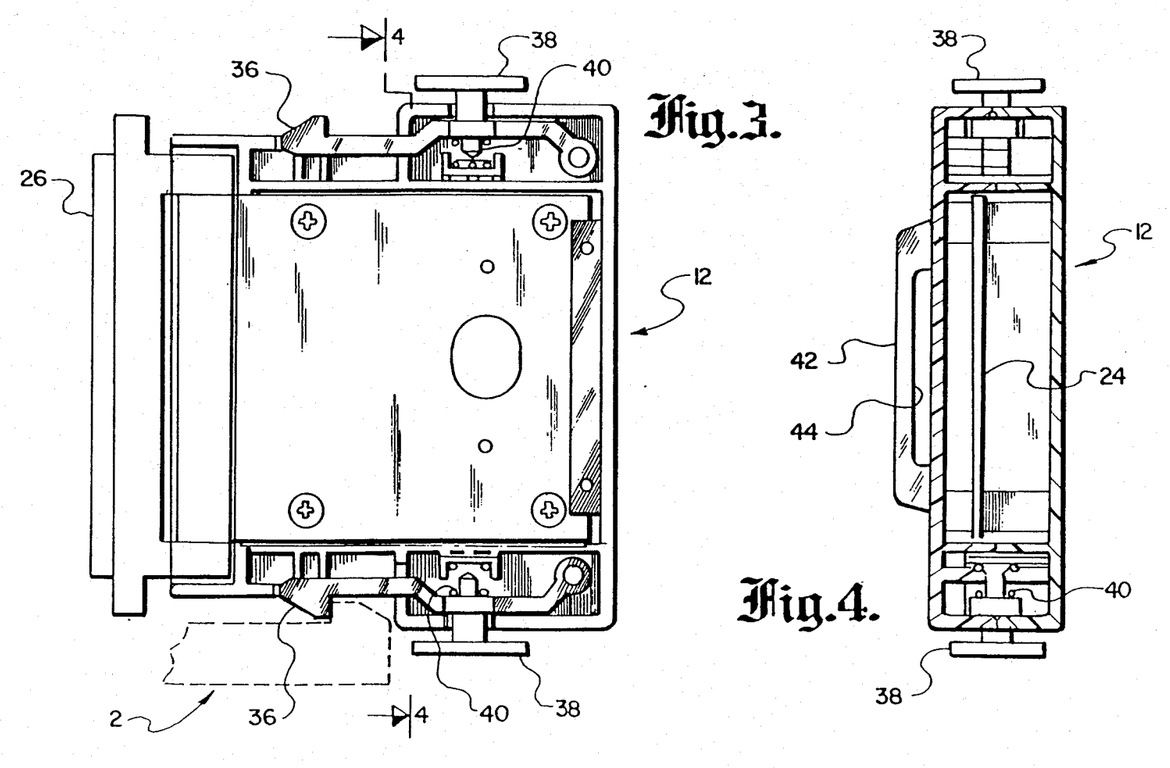
FIG. 3 is a plan sectional view of a program cartridge used in connection with the tester.
FIG. 4 is a sectional view taken along the line 4—4 of FIG. 3.

Referring now to FIGS. 3 and 4, the principal mechanical features of the program cartridges are shown. Each cartridge is provided with spring-biased squeezable latches 36 on each side that can be squeezed inwardly by means of finger pads 28 acting against coil springs 40, permitting the cartridge to be inserted into the receptacle in the tester body 2. The spring-biased latches are then released, latching the cartridge into place in the receptacle. The cartridge is easily removed when desired by simply pressing in on finger pads 38 to release the latch and pulling the cartridge out. To ensure proper placement in the tester, the top of the cartridge is provided with a bracket 42 that includes slot 44 which receives a corresponding locator tab extending in from the tester.

Figures 2, 5, 6:
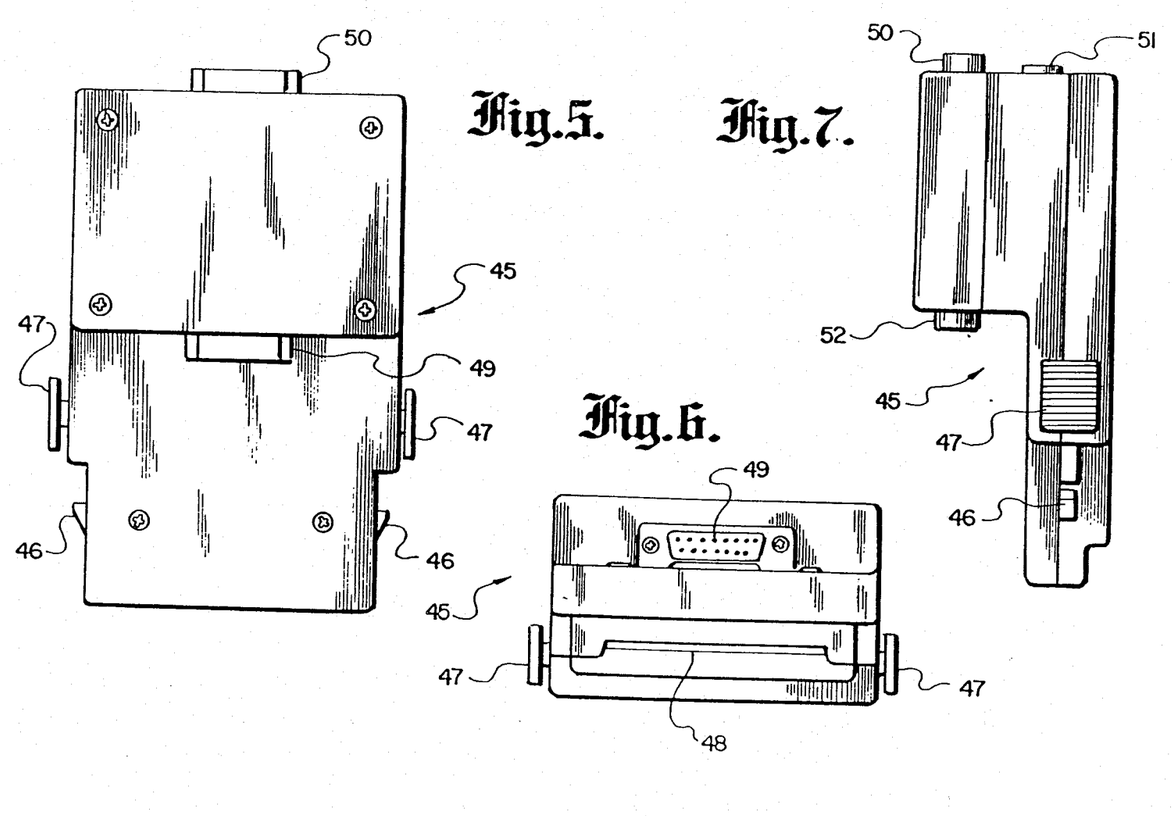

A special input/output cartridge which provides for a connection with both the tester ALDL ports and the input/output receptacle is shown in FIGS. 5, 6 and 7. This auxiliary cartridge 45 provides the low power standby vehicle data monitor "snapshot" capability referred to previously. Its forward end includes a pair of latches 46 and finger pads 47 on either side which releasably connect the cartridge to the tester input/output receptacle. An edge board connector 48 makes electrical contact with the tester within the receptacle. The upper portion of this specialty input/output cartridge 45 includes a female socket 49 which plugs into the corresponding pin socket on the tester in place of ALDL connector 14, with the ALDL connector reconnected to a corresponding female connector 50 on the rear of cartridge 45. This interception of the ALDL cable is used to provide serial link activity monitoring and power moding control. In addition, a separate cable is attached to the cartridge at connector 51 to provide the operator trigger control/indicator operations.

Figures 8, 9:
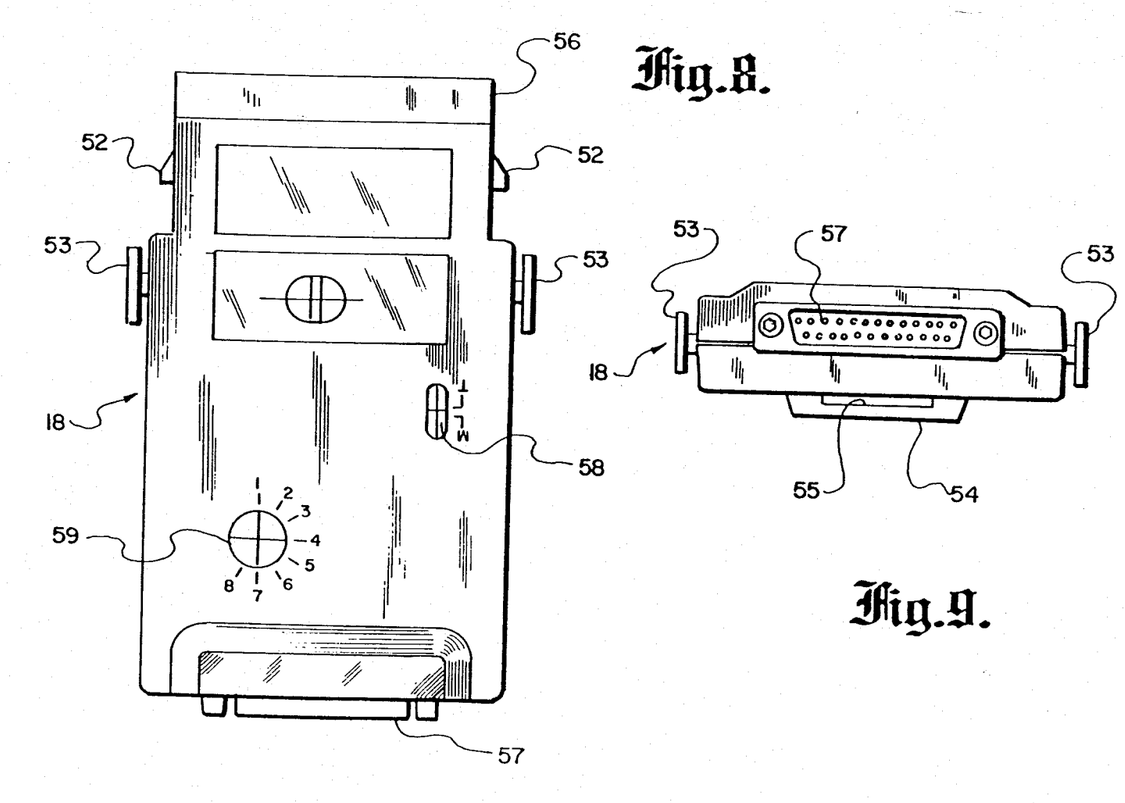
FIGS. 8 and 9 are respectively plan and side elevational views of another input/output cartridge used as a communications interface for the tester.

Another input/output cartridge which houses standard RS232 communications interface electronics appears in FIGS. 8 and 9. This cartridge 18 in similar in outward construction to the program cartridge 12, and includes a pair of spring-biased squeezable latches 52 on each side that can be squeezed inwardly by finger pads 53, permitting the cartridge to be inserted and releasably latched in the tester's input/output receptacle. The bottom of the cartridge is provided with a bracket 54 that includes a slot 55 which receives a corresponding locator tab extending in from the tester to ensure proper placement. An edge board connector 56 at one end of the cartridge makes electrical contact with the tester within the input/output receptacle, while a multipin socket 57 at its other end receives a communications cable. A switch 58 is provided to switch the cartridge between an M mode in which data is sent to a peripheral device such as a modem, printer, etc., and at test mode in which the RS232 cartridge is connected to an external computer for developing and debugging test software. An eight position switch 59 allows the RS232 data rate to be varied from 160 up to 19,200 BAUD.

For other applications requiring a separate input/output cartridge, such as hydramatic power train, digital volt meter and air conditioner diagnostics, an input/output cartridge similar in physical construction to the program cartridge shown in FIGS. 3 and 4 is inserted into the tester's input/output receptacle, with the ALDL connector 14 left in place.

Figure 10:
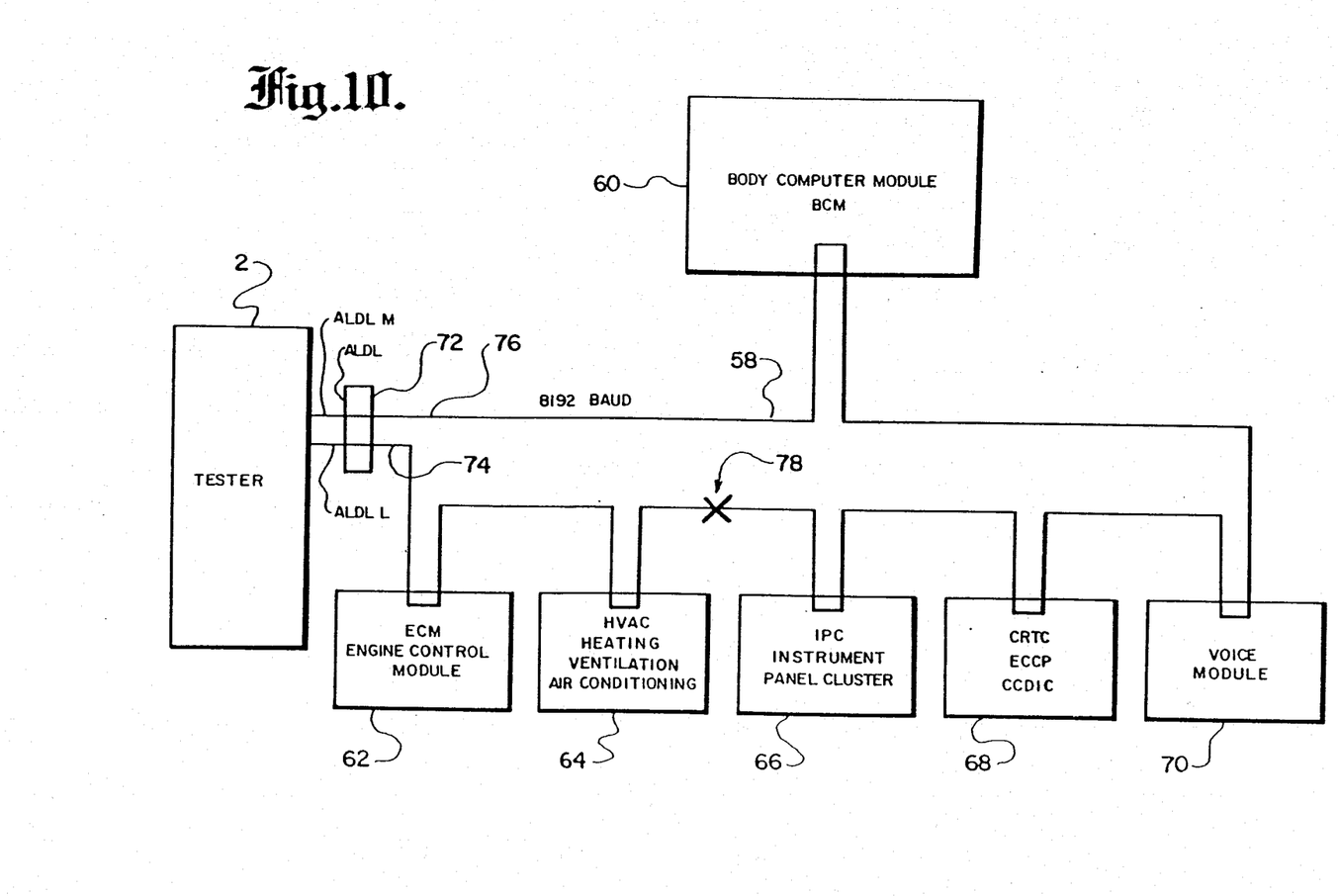
FIG. 10 is a block diagram showing the connection of the tester to an automobile electronics data bus.

The manner in which the tester is connected via the ALDL connector to a vehicle's electronics data bus is illustrated in FIG. 10. The electronics data bus 58 interconnects various vehicle electronics subsystems, such as BCM 60; ECM 62; HVAC 64; IPC instrument panel 66; a secondary display subsystem 68 consisting of a CRT controller (CRTC), an electronic climate control panel (ECCP) or a climate control and diagnostic information center (CCDIC); and a voice module 70.

The vehicle's ALDL 72 is connected onto the electronics data bus 58 for final assembly line testing at the factory. It connects to two terminals 74, 76 on the data bus. This type of bus, in which the two terminals form a loop with the varying subsystems, is referred to as a "ring" bus.

Prior field electronics testing was generally limited to a passive readout of the ECM by means of a diagnostic unidirectional serial data line sourced by the ECM and brought out to the ALDL connector. In the present invention, by contrast, the tester 2 is connected to the electronics bidirectional operational data bus 58 by means of the ALDL 72. This is believed to be a unique use of the data bus, which was not designed primarily for diagnostics as was the ECM diagnostic serial data line. The present tester in essence becomes an integral part of the electronics operational system by connecting onto the data bus. This novel use of the data bus opens up many possibilities for diagnostic testing that could not be performed previously. The tester can be used to emulate or exercise any of the vehicle's subsystems which are connected to the data bus, while monitoring the other subsystems to detect and identify any malfunctions. The ALDL is not believed to have been previously used for this type of field testing, and in factory testing it is believed to have been used only as a one-way communications link to read out data from the BCM; the ECM is generally accessed in the factory either through the ALDL or directly through the ECM.

Applicant's novel approach provides a substantial advantage in the testing of modern electronics systems, in that many vehicle functions utilize a number of different electronic subsystems. For example, operating the air conditioning involves five subsystems: ECM 62, HVAC 64, IPC 66, ECCP 68 and BCM 60. The identification of the particular subsystem responsible for an air conditioner malfunction can be very difficult with conventional testing methods. The present invention enables each of the subsystems in turn to be exercised while the data bus 58 is monitored to quickly and easily determine the location and nature of the problem.

For the tester to gain full control of the electronics data bus 58, the BCM 60 must be effectively decoupled from the bus. However, simply disconnecting the BCM from the data bus will result in the shutdown of the total system operation. Applicant has arrived at the novel solution of using his program cartridges to load a special program into the BCM which keeps it functioning in a slave state but allows the tester to take over control and emulate the other subsystems on the data bus. This technique is employed for the various testing applications which use the BCM. Operating as the master, the tester can emulate any subsystem by sourcing subsystem messages and transmitting them to the other subsystems. The tester can also read data from any subsystem or control the subsystem by sending control data to it.

Figure 11:
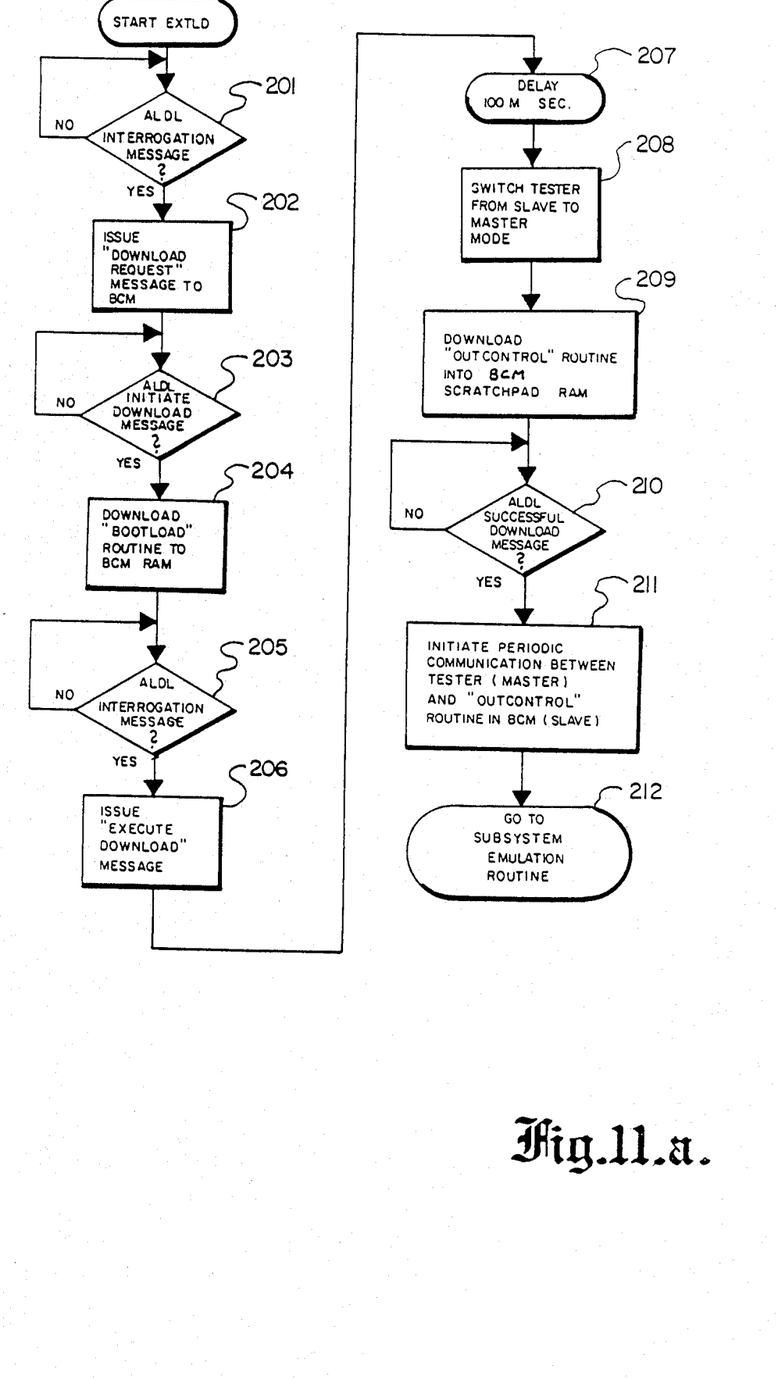
FIGS. 11a, 11b and 11c are collectively a flow diagram of the program applied to the automobile's body computer module to emulate the operation of various automotive systems and thereby effectively decouple the master controller from the electronic data bus during testing.

A flow diagram of the program which is loaded into the BCM is provided in FIGS. 11a-11c. Referring first to FIG. 11a, the BCM emulation starts with the tester executing an External Load (EXTLD) routine which first downloads a BOOTLOAD routine, Outcontrol (OUTCNTRL), into the BCM; and then jumps to execute the desired subsystem control or emulation routine. The tester waits for an ALDL interrogation message 201 from the BCM. It issues a "Download Request" message 202 to the BCM and waits for a response 203 from the BCM indicating that it is ready for the download routine. The tester then downloads the BOOTLOAD routine 204 into the BCM RAM over the system bus and waits for an ALDL interrogation message 205 from the BCM. The tester then issues an "Execute Download" message 206 to the BCM over the system bus, delays 100 msec 207, switches the tester from the slave mode to the master mode 208, and downloads an OUTCNTRL routine 209 into the BCM scratchpad RAM via the system bus. When a successful download message 210 is received from the BCM, the tester initiates periodic communication to the OUTCNTRL routine 211 executing in the BCM and then jumps to the desired subsystem emulation or control routine 212.

The BOOTLOAD routine which is loaded into the BCM from the tester puts the BCM into the slave mode waiting for messages from the tester. If a message is not received within a pre-specified time, the BCM reverts back to the master mode. The function of this routine is to accept data messages from the tester and store them in scratchpad RAM. The sum of these messages constitute an executable routine called OUTCNTRL to which the BCM jumps and executes upon successful completion of storing all of the routine in RAM.

The execution of BOOTLOAD is shown in FIG. 11b in which first output compare timers, time-out timers 213, and serial communication port/variables 214 are initialized. The BCM monitors the system bus for data 215 and, if no data is received, it checks to see if it is time to toggle a Computer Operate (COP) timer 219. If the toggle time has not arrived, the BCM returns to monitor for serial data received 215. If it is time to toggle the COP, the COP is toggled 220 to prevent the BCM from automatically resetting. The time-out timer is decremented 221 and then checked to see if the time since the last received valid message has exceeded the time limit 222 and, if it has, the BCM jumps to the reset vector 223 where the BCM is reset and assumes normal operation, including control of the system bus. If serial data has been received 215 it is checked for validity 216 and, if it is not valid, it is ignored and the serial data ports and variables are reinitialized 214. If the data is valid it is saved, and a message sumcheck and byte counter are updated 217. The message is then checked for completion 218 and, if it is complete, the BCM jumps to the loaded OUTCNTRL routine and starts executing 224.

The OUTCNTRL routine causes the BCM to act as a slave subsystem which receives and processes messages from the tester, which operates as the master. The tester can command the BCM to set its output discretes high or low, to slew its analog outputs, or to read its analog inputs. It can also command the BCM to go idle, or tell it to quit operating as a slave and return to its normal operating mode. When executing this routine, the BCM also checks for valid bus activity and will revert back to the normal operating mode if it does not detect proper activity. The opertion of OUTCNTRL is shown in FIG. 11c, in which it first initializes Output compare timer and loss of communication timers 225 and then transmits a "Download Acknowledge" message 226 to the tester. It continually checks the timers and periodically toggles the COP 227, and checks to see if communication has been lost at any time 228. If communication has been lost, the routine jumps to a reset condition 229 and starts operating as a normal BCM. If communication is normal, it checks 230 and processes 231 received data, and checks messages for validity 232 in a manner similar to the BOOTLOAD routine. When a valid message is received the routine processes the message and responds to its command 233, clears the communication loss timer 234, and transmsits a "Command Acknowledge" message 235 to the tester. This sequence continues until the tester sends a "Quit" command, at which time the BCM reverts back to its normal operation as system bus master.

Returning to FIG. 10, the tester makes a pair of separate connections to the ALDL through leads ALDL M and ALDL L. The test signals which are applied from the tester to the data bus are multiplexed onto these two leads such that they alternate between the two leads or are delivered to both simultaneously. This technique is very useful in determining the presence and location of any faults which may develop on the data bus. For example, assume that fault appears on the data bus at location 78 between the HVAC 64 and IPC 66. The tester can be programmed to determine that signals on ALDL L penetrate only to HVAC 64, while signals on ALDL M penetrate only to IPC 66, or conversely that only signals from ECM 62 and HVAC 64 are deliverd to ALDL L and only signals from the remaining subsystems are delivered to ALDL M. The location of the data bus fault can thus be readily determined. In addition, connection through the ALDL makes it possible to access all of the connected systems and continue normal testing despite the presence of a fault on the data bus.

Figure 12:
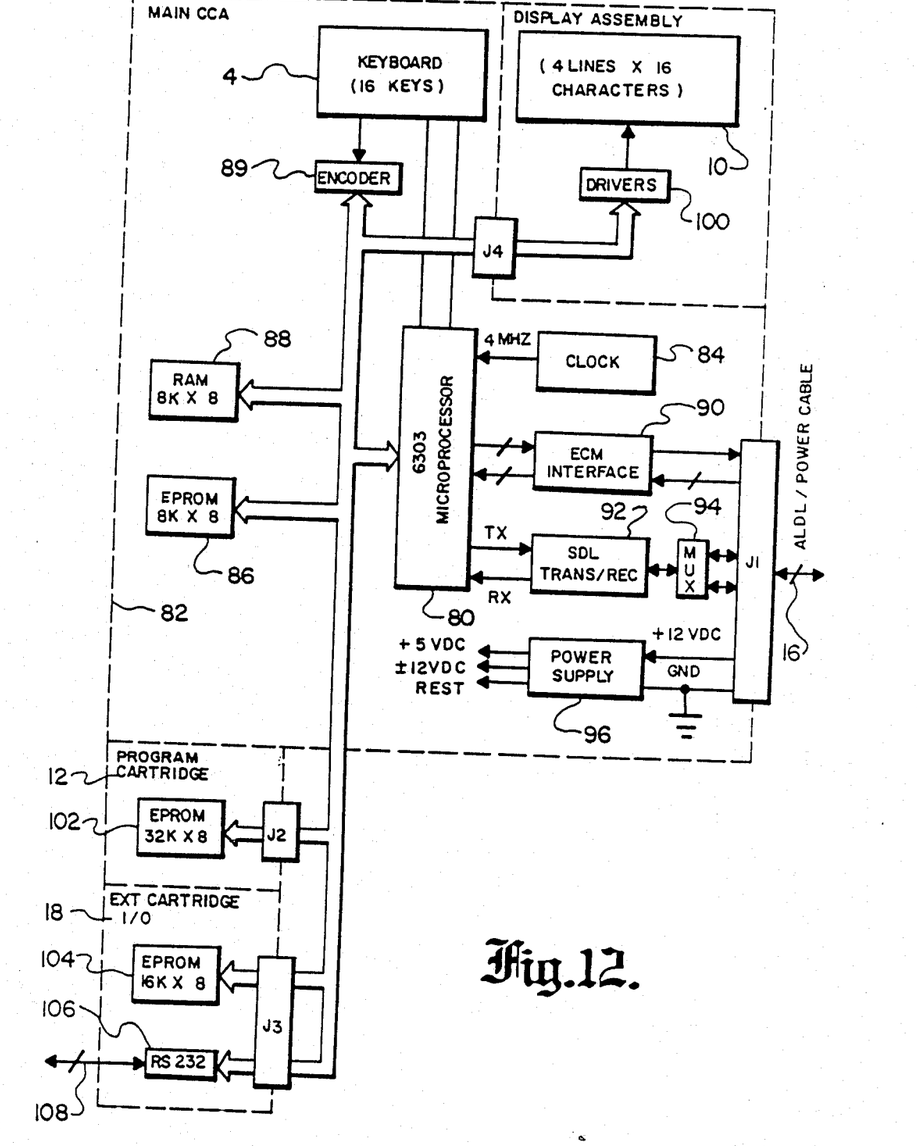
FIG. 12 is a block diagram of the electronic components employed in the tester.

A block diagram of the tester is provided in FIG. 12. The main circuit card assembly includes the microprocessor 80, which in the preferred embodiment is based on the Motorola CMOS 6303. The main circuit board assembly 82 is a two-layer printed wiring board with dual-in-line package ICs, chip capacitors and resistors. In addition to the microprocessor, the main circuit board contains a 4MHz clock oscillator 84, a 64k on-board ultraviolet EPROM 86, a 64k scratchpad CMOS RAM 88, the keyboad 4 and keyboard encoder 89, an ECM interface 90, an 8192 BAUD (bits per second) serial data link transceiver 92 whose impedance is substantially matched with that of the vehicle electronics data bus, a multiplexer circuit 94 connected to the transceiver, and an internal power supply circuit 96 which conditions power from the vehicle data bus for use by the tester. It is preferably a switching power supply which provides full operation over 5.1 to 24 VDC input voltage with transient and reverse polarity protection. EPROM 86 constitutes the built-in software routines which provide timing sequences and interrupts, processes and decodes the keyboard, places data on display, controls communications with the vehicle data bus and provides basic utility packages and tester self-test routines.

The display 10 is provided on a separate circuit board and is connected to the microprocessor bus via the display drivers 100. The ALDL receptacle J1 provides an interconnection between the ALDL/power cable 16 and the ECM interface 90, multiplexer 94 and power supply 96. The internal microprocessor bus is brought out on a wire harness that terminates at 40 pin connectors in the program cartridge receptacle J2 and the input/output cartridge receptacle J3. The program cartridge is shown with a 256K EPROM 102 and the I/O cartridge with a 128K EPROM 104 which provide appropriate controls to the microprocessor. The input/output cartridge is also shown as including an RS232 communications interface 106 which, among other things, can be used to test the car from a remote location via communications line 108.

Figure 13:
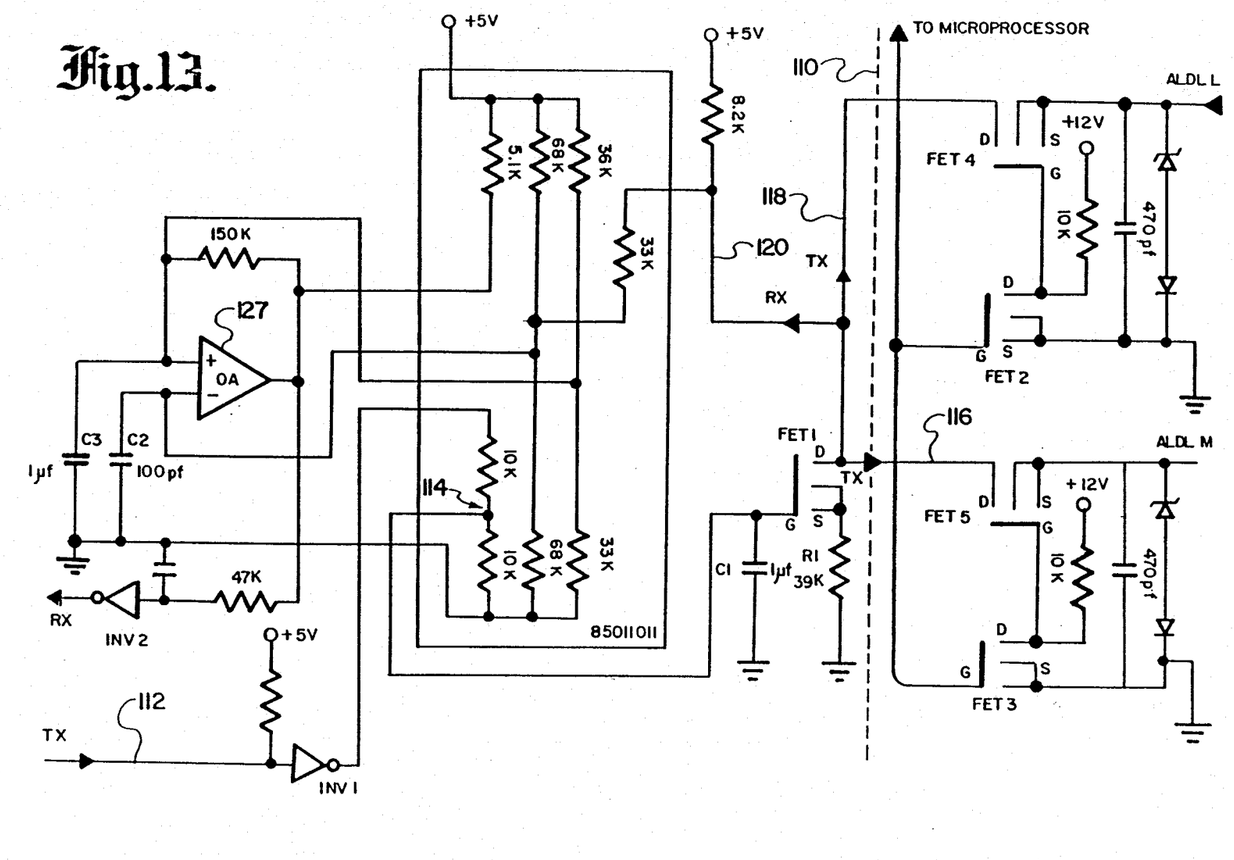
FIG. 13 is a schematic diagram of the circuitry used in the transceiver and multiplexer portions of the tester.

A schematic diagram of the transceiver 92 and multiplexer 94 sections of the tester circuitry is given in FIG. 13. The multiplexer section is shown to the right of dashed line 110, and the transceiver section to the left. Signals to be transmitted to the ALDL connector are received from the microprocessor on line 112 and transmitted through the transceiver via an invertor INV1 and voltage divider 114 to the gate of a field effect transistor FET1 which is protected by a filter capacitor C1. The source of FET1 is connected to ground through resistor R1, while the signal to be transmitted to the ALDL is delivered to the multiplexer over lines 116 and 118. Signals received by the multiplexer for transmission back to the microprocessor enter the transceiver over line 120, from whence they are delivered to the inverting input of an operation amplifier 122. The inverting and non-inverting inputs of OP amp 122 are connected to ground through capacitors C2 and C3, respectively, while the amplifier output is delivered through invertor INV2 to the microprocessor.

The multiplexer has two switching circuits, one connected to the terminal for ALDL L and the other to the terminal for ALDL M. The two switching circuits include switching transistors FET2 and FET3, respectively. The gates of these transistors are controlled individually from the microprocessor such that the switching states of the two transistors may be alternated or operated in common, as desired. FET2 controls another switch FET4, which makes or breaks a connection between ALDL L and line 118. In a similar manner, FET3 controls another switch FET5 which makes or breaks a connection between ALDL M and line 116. The multiplexer switches are operated under microprocessor control to both transit signals to and receive signals from ALDL.

Figure 14:
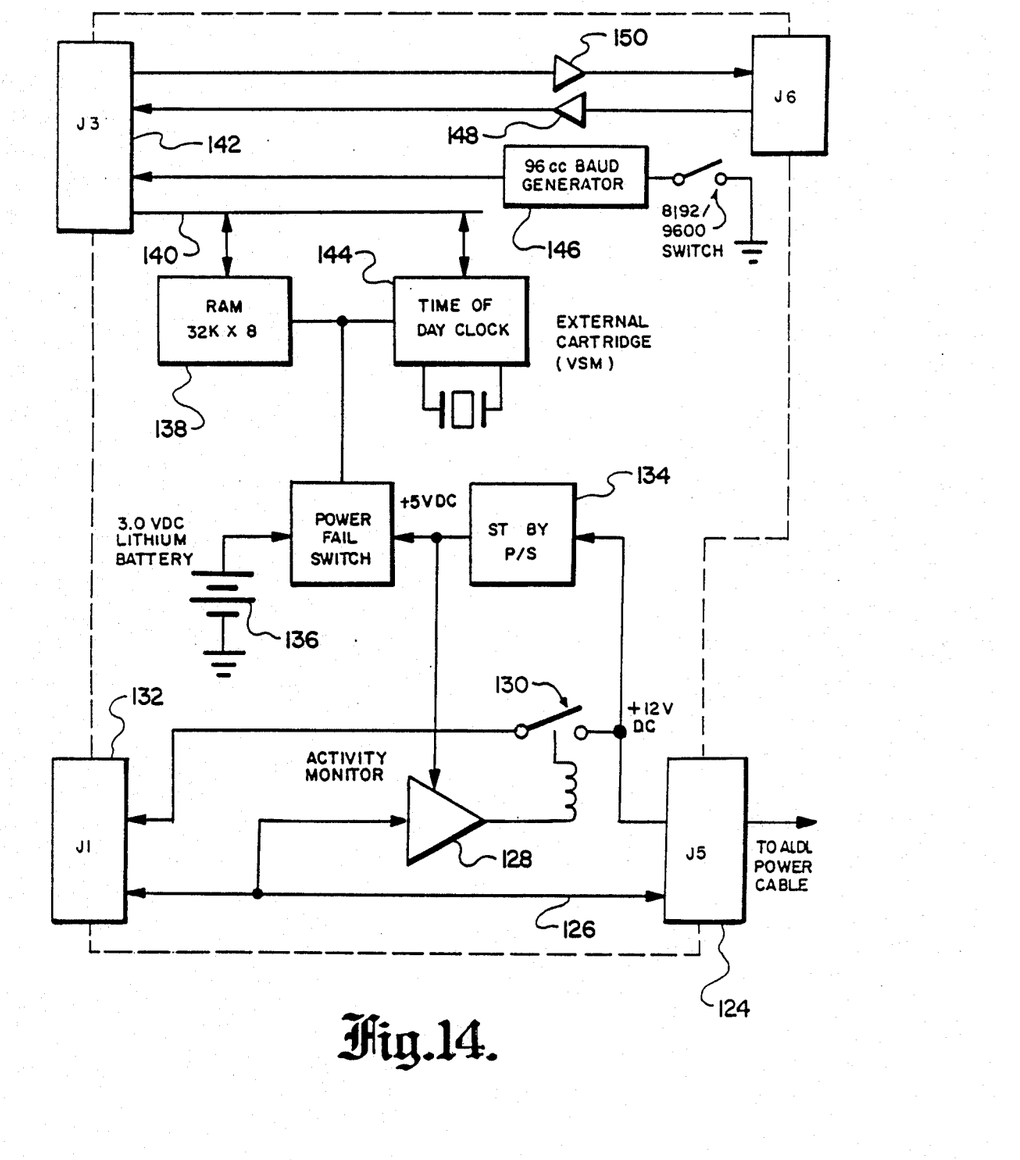
FIG. 14 is a block diagram of an input/output cartridge used to monitor the automobile electronics for intermittent malfunctions.

Turning now to FIG. 14, a block diagram of the circuitry employed by the specialized input/output module 46 of FIGS. 5-7 is shown. This cartridge is used to monitor vehicle performance during normal operation away from the service center to detect intermittent malfunctions that might not occur at the service center. A special low power standby control is provided to keep the tester from draining the vehicle battery when the engine is not running. The tester is connected to the vehicle in a low power standby state during which the vehicle's electronic data bus is watched for changes of state. When data bus activity is detected, the cartridge turns the tester on and monitors the bus for data indicative of an intermittent malfunction. When a malfunction condition is detected, the cartridge stores both the status of the systems being monitored and the time at which the reading is taken in memory.

A connection is made to the ALDL/power cable via terminal 124 such that the cartridge data bus 126 carries the same signal as the vehicle electronics data bus. The activity monitor circuit 128 monitors the data bus 126 and activates a relay 130 when the data bus becomes active indicating that the vehicle is running. The closing of relay 130 completes a circuit between the tester via terminal 132 and the vehicle power via terminal 124 to provide operating power to the tester. Vehicle power is brought into the cartridge via terminal 124 and is applied to a standby power circuit 134 to power the cartridge RAM 138, a time of day clock 144, and the activity monitor 128. It is also brought to the tester main power relay 130. Upon closing of the power relay, the tester becomes active and monitors the data it receives on line 126 for malfunction conditions. When a malfunction is detected, the tester logs the data into a 256K RAM 138, via line 140 and terminal 142, along with the value of the time of day clock 144 to log the time at which the malfunction occurred. A battery 136 is provided to keep power on the volatile RAM 138 when the tester is disconnected from the vehicle. A timing circuit 146 provides a bit rate of either 9600 or 8192 bits per second, depending upon the internal vehicle bit rate, to junction 142. A manual button input circuit 148 is also provided so that data can be stored whenever desired, and an indicator light driver circuit 150 can also be provided to turn on a light indicating that the cartridge has captured data.

A novel vehicle testing system and method has thus been described which has four different levels of diagnostic testing. First, it provides monitoring and control of individual vehicle subsystems for malfunction isolation supported by the technician's intuitive input. Second, it provides detailed diagnostic testing in conjunction with the vehicle manufacturer's service manuals. Third, it offers specialized subsystem testing by means of specialized diagnostic programs for automatic isolation to the faulty subsystem. Fourth, it provides for the trouble-shooting of intermittent faults by the diagnostic capture of data upon the occurrence of fault conditions. It is much faster than presently available testing methods, offers a more comprehensive and accurate analysis of vehicle malfunctions, and provides much more flexibility than previous systems. While particular embodiments have been shown and described, numerous variations and alternate embodiments will occur to those skilled in the art. Accordingly, it is intended that the invention be limited only in terms of the appended claims.

I claim:

1. A method of testing an automobile's electronic systems which control associated mechanical functions, the operation of said mechanical functions effecting other electronic elements or systems which are part of, or related to the controlling system, for an automobile having an electronics data bus and an associated assembly line diagnostic link (ALDL) which is connected to provide access to the electronics data bus, comprising:

applying a sequence of test signals from a location external to the automobile to a selected one of the automobile's electronic systems via said ALDL and electronics data bus, without interrupting any electrical connections to the automobile's electronic systems, to exercise the mechanical function controlled by the selected electronic system, monitoring via said ALDL and electronics data bus at least one of the electronic systems in the automobile which are part of, or related to the selected system as said mechanical function is exercised to detect malfunctions in the selected electronic system or the monitored system, and providing an indication of any detected malfunctions.

2. The automobile testing method of claim 1, for automobiles having at least some electronic elements or systems which are not accessible via the ALDL, wherein, in addition to the application of test signals and monitoring of test results via the ALDL, test signals are applied directly to and test results are monitored directly from at least one of the electronic elements or systems which are not accessible via the ALDL.

3. The automobile testing method of claim 1, for an automobile having a master controller and various electronic subsystems connected to the electronics data bus, further comprising the step of effectively decoupling the master controller from the electronics data bus, without physically interrupting any electrical connections between the master controller and electronics data bus 4. The automobile testing method of claim 1, for an automobile in which the electronics data bus is a ring bus and its associated assembly line diagnostic link includes a pair of output terminals, wherein signals transmitted to or received from the data bus are multiplexed onto both terminals, thereby enabling automobile systems on the electronics data bus to be accessed for testing despite a fault on the bus.

5. The automobile testing method of claim 1, wherein said associated electronics systems are monitored for operation in a relatively low power mode, and a relatively high power operating mode is initiated in response to the start-up of the electronic systems operation for the detection of a malfunction to place the data being monitored at the time of the malfunction into memory.

6. The automobile testing method of claim 3, wherein the master controller is effectively decoupled from the electronics data bus by loading the master controller with a program that places it in a slave state relative to an external tester thereby allowing for emulation of the various electronics subsystems by said external tester.

* * * * *